United States Patent
Liu et al.

(10) Patent No.: US 9,834,435 B1
(45) Date of Patent: Dec. 5, 2017

(54) STRUCTURE AND FORMATION METHOD OF SEMICONDUCTOR DEVICE STRUCTURE

(71) Applicant: Taiwan Semiconductor Manufacturing Co., Ltd., Hsinchu (TW)

(72) Inventors: Ping-Yin Liu, New Taipei (TW); Xin-Hua Huang, Xihu Township, Changhua County (TW); Yeong-Jyh Lin, Caotun Township, Nantou County (TW); Jung-Huei Peng, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/363,389

(22) Filed: Nov. 29, 2016

(51) Int. Cl.
*B81B 7/00* (2006.01)
*B81C 1/00* (2006.01)

(52) U.S. Cl.
CPC ........ *B81B 7/0058* (2013.01); *B81C 1/00269* (2013.01); *B81B 2203/0315* (2013.01); *B81B 2207/015* (2013.01); *B81C 2203/0109* (2013.01); *B81C 2203/0172* (2013.01); *B81C 2203/0735* (2013.01)

(58) Field of Classification Search
CPC .......... B81B 7/0058; B81B 2203/0315; B81B 2207/015; B81C 1/00269; B81C 2203/0172; B81C 2203/0109; B81C 2203/0735
See application file for complete search history.

(56) References Cited

U.S. PATENT DOCUMENTS

| | | | |
|---|---|---|---|
| 8,883,535 B2 * | 11/2014 | Liu | B81C 1/00793 257/222 |
| 8,987,059 B2 | 3/2015 | Liang et al. | |
| 9,040,334 B2 | 5/2015 | Chu et al. | |
| 9,065,358 B2 | 6/2015 | Tsai et al. | |
| 9,085,455 B2 | 7/2015 | Cheng et al. | |
| 9,085,456 B2 | 7/2015 | Tsai et al. | |
| 9,122,827 B2 | 9/2015 | Chen et al. | |
| 9,133,017 B2 | 9/2015 | Liang et al. | |
| 9,138,994 B2 | 9/2015 | Peng et al. | |
| 9,139,420 B2 | 9/2015 | Chang et al. | |
| 9,139,423 B2 | 9/2015 | Chien et al. | |
| 9,181,083 B2 | 11/2015 | Tsai et al. | |
| 9,187,317 B2 | 11/2015 | Cheng et al. | |
| 9,233,839 B2 | 1/2016 | Liu et al. | |
| 9,236,877 B2 | 1/2016 | Peng et al. | |
| 9,238,581 B2 | 1/2016 | Wu et al. | |

(Continued)

*Primary Examiner* — David Vu
(74) *Attorney, Agent, or Firm* — Birch, Stewart, Kolasch & Birch, LLP

(57) ABSTRACT

Structures and formation methods of a semiconductor device structure are provided. A semiconductor device structure includes a semiconductor substrate including a cavity and a movable feature in the cavity. The semiconductor device structure also includes a cap substrate bonded to the semiconductor substrate to seal the cavity. There is an interface between the cap substrate and the semiconductor substrate. The semiconductor device structure further includes a sealing feature embedded in the semiconductor substrate and surrounding the cavity. The sealing feature extends across the interface and penetrates through the cap substrate.

20 Claims, 11 Drawing Sheets

(56) References Cited

U.S. PATENT DOCUMENTS

| | | |
|---|---|---|
| 2014/0287548 A1 | 9/2014 | Lin et al. |
| 2015/0137303 A1 | 5/2015 | Chou et al. |
| 2015/0175405 A1 | 6/2015 | Cheng |
| 2015/0175407 A1 | 6/2015 | Cheng et al. |
| 2015/0196912 A1 | 7/2015 | Tsai et al. |

* cited by examiner

STRUCTURE AND FORMATION METHOD OF SEMICONDUCTOR DEVICE STRUCTURE

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Micro-electro mechanical system (MEMS) devices have recently been developed. MEMS devices include devices fabricated using semiconductor technology to form mechanical and electrical features. The MEMS devices may include a number of elements (e.g., movable elements) for achieving mechanical functionality.

MEMS applications include motion sensors, pressure sensors, printer nozzles, or the like. Other MEMS applications include inertial sensors, such as accelerometers for measuring linear acceleration and gyroscopes for measuring angular velocity. Moreover, MEMS applications may extend to optical applications, such as movable mirrors, and radio frequency (RF) applications, such as RF switches and the like.

Although existing devices and methods for forming MEMS devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
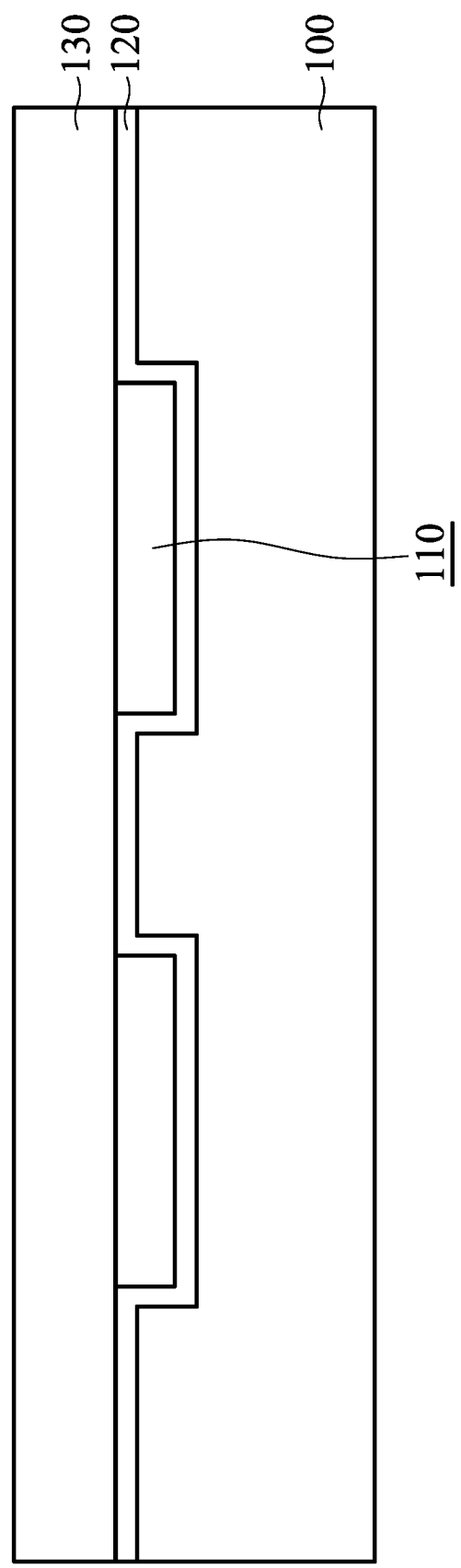
FIGS. 1A-1H are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1H are cross-sectional views of various stages of a process for forming a package structure, in accordance with some embodiments. Additional operations can be provided before, during, and/or after the stages described in FIGS. 1A-1H. Some of the stages that are described can be replaced or eliminated for different embodiments. Additional features can be added to the package structure. Some of the features described below can be replaced or eliminated for different embodiments. Although some embodiments are discussed with operations performed in a particular order, these operations may be performed in another logical order.

As shown in FIG. 1A, a substrate 100 is provided, in accordance with some embodiments. In some embodiments, the substrate 100 is a wafer. In some embodiments, the substrate 100 is a device substrate including active elements. The active elements may include transistors, diodes, or other suitable active elements. The device substrate may be a complementary metal-oxide semiconductor (CMOS) device, a CMOS imaging sensor (CIS) device, or another suitable device.

Many variations and/or modifications can be made to embodiments of the disclosure. In some other embodiments, the substrate 100 is a substrate including circuits. The substrate 100 is used to provide electrical connections. The substrate 100 may not include an active element.

In some embodiments, the substrate 100 includes silicon or another elementary semiconductor material such as germanium. In some other embodiments, the substrate 100 includes a compound semiconductor. The compound semiconductor may include gallium arsenide, silicon carbide, indium arsenide, indium phosphide, another suitable compound semiconductor, or a combination thereof.

In some embodiments, the substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

As shown in FIG. 1A, cavities including a cavity 110 are formed in the substrate 100 and a bonding layer 120 is formed over the substrate 100, in accordance with some embodiments. In some embodiments, the bonding layer 120 covers the substrate 100 and extends into the cavity 110. The bonding layer 120 does not fill up the cavity 110.

In some embodiments, the bonding layer 120 includes a silicon-containing material, an adhesive material, another suitable material, or a combination thereof. The silicon-containing material may include silicon, silicon oxide, silicon nitride, silicon carbon nitride, silicon carbide, or another suitable material. The adhesive material may include polymer (such as benzocyclobutene (BCB)), glue, epoxy, photoresist, another suitable adhesive material, or a combination thereof.

As shown in FIG. 1A, a semiconductor substrate 130 is aligned and bonded to the substrate 100, in accordance with some embodiments. In some embodiments, the semiconductor substrate 130 is bonded to the substrate 100 through the bonding layer 120. In some embodiments, the cavity 110 in the substrate 100 is substantially hermetically sealed by the semiconductor substrate 130.

In some embodiments, the semiconductor substrate 130 is a bulk wafer. In some embodiments, the semiconductor substrate 130 includes silicon or another elementary semiconductor material such as germanium. In some other embodiments, the semiconductor substrate 130 includes a compound semiconductor. The compound semiconductor may include gallium arsenide, silicon carbide, indium arsenide, indium phosphide, another suitable compound semiconductor, or a combination thereof. In some embodiments, the semiconductor substrate 130 includes a SOI substrate.

In some embodiments, the semiconductor substrate 130 is bonded to the substrate 100 by using a fusion bonding process, an anodic bonding process, an adhesive bonding process, a glass frit bonding process, a surface activation bonding (SAB) process, another suitable bonding process, or a combination thereof. In some embodiments, an annealing process is subsequently performed over the semiconductor substrate 130 and the substrate 100 to increase the bonding strength. For example, a rapid thermal annealing process is performed. In some other embodiments, no annealing process is performed after the semiconductor substrate 130 is bonded to the substrate 100.

Figure 1B:
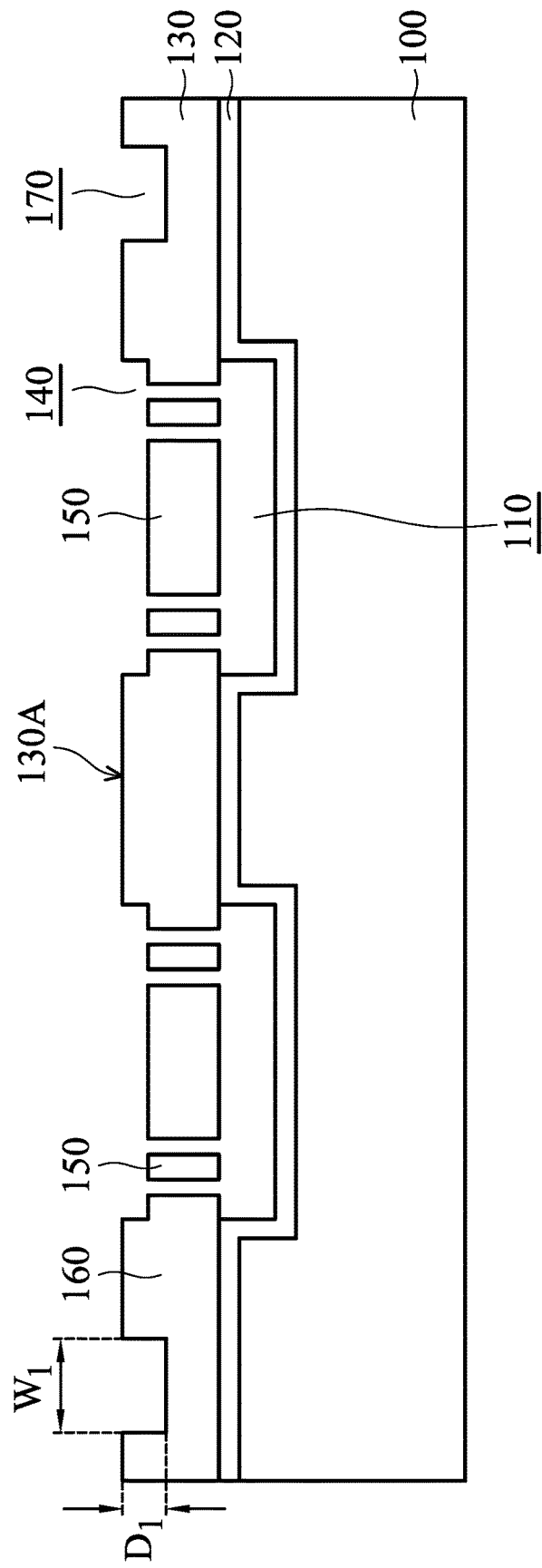

As shown in FIG. 1B, the semiconductor substrate 130 is partially removed to form cavities including a cavity 140, in accordance with some embodiments. The cavity 140 extends from the surface 130A of the semiconductor substrate 130 into the semiconductor substrate 130. The cavity 140 is substantially aligned to the cavity 110 in the substrate 100 so that the cavity 140 is connected with the cavity 110.

As shown in FIG. 1B, the semiconductor substrate 130 is patterned due to the formation of the cavity 140, in accordance with some embodiments. As a result, one or more movable (flexible) features 150 and static (fixed) features 160 are defined in the semiconductor substrate 130. The movable features 150 are suspended in the cavity 140, and the cavity 140 allows the movable features 150 to have free movement in at least one axis to achieve mechanical functionality. For example, the movable features 150 are capable of bending, vibrating, and/or deforming. The movable features 150 may also be referred to as proof masses. Multiple deposition, coating, and/or etching processes may be used to form the cavities including the cavity 140 and the movable features 150 in the cavity 140.

In some embodiments, the semiconductor substrate 130 including the movable features 150 is a micro-electro mechanical system (MEMS) device. The movable features 150 may also be referred to as MEMS features. The MEMS features may include actuators, sensors, valves, gears, mirrors, heaters, printer nozzles, another suitable MEMS features, or a combination thereof. However, embodiments of the disclosure are not limited thereto. The semiconductor substrate 130 may be another suitable device.

As shown in FIG. 1B, trenches including a trench 170 are formed in the semiconductor substrate 130, in accordance with some embodiments. The trench 170 extends from the surface 130A of the semiconductor substrate 130 into the static features 160 of the semiconductor substrate 130. In some embodiments, the trench 170 does not penetrate through the semiconductor substrate 130.

In some embodiments, the trench 170 is a ring trench. In some embodiments, the trench 170 continuously surrounds the cavities including the cavity 140. In some embodiments, the trench 170 is separated from the cavities including the cavity 140. In some embodiments, the trench 170 continuously surrounds the movable features 150.

In some embodiments, the width $W_1$ of the trench 170 is in a range from about 50 nm to about 90 μm. In some embodiments, the trench 170 is narrower than the cavity 140. In some embodiments, the trench 170 is shallower than the cavity 140. However, embodiments of the disclosure are not limited thereto.

In some embodiments, the sidewalls of the trench 170 are substantially perpendicular to the surface 130A of the semiconductor substrate 130. In some other embodiments, the sidewalls of the trench 170 are inclined to the surface 130A of the semiconductor substrate 130. The trench 170 may gradually shrink along a direction from the surface 130A of the semiconductor substrate 130 towards the substrate 100. The size and/or profile of the trench 170 can be varied according to requirements.

Multiple deposition, coating, and/or etching processes may be used to form the trenches including the trench 170. In some embodiments, the trench 170 and the cavity 140 are formed during the same stage by the same process. In some other embodiments, the trench 170 and the cavity 140 are formed in different stages.

Figure 1C:
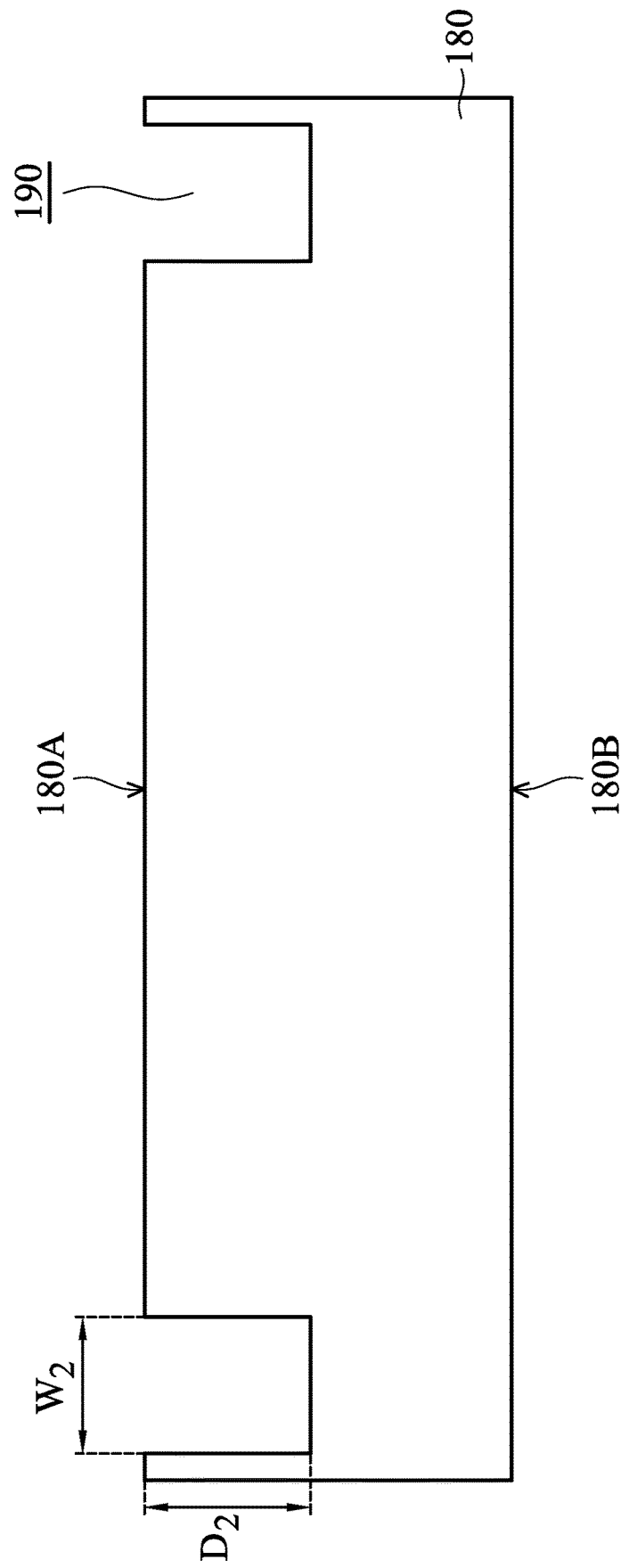

As shown in FIG. 1C, a cap substrate 180 is provided, in accordance with some embodiments. In some embodiments, the cap substrate 180 is a wafer. In some embodiments, the cap substrate 180 includes a semiconductor-containing material, a glass-containing material, another suitable bondable material, or a combination thereof.

As shown in FIG. 1C, trenches including a trench 190 are formed in the cap substrate 180, in accordance with some embodiments. The trench 190 extends from the surface 180A of the cap substrate 180 into the cap substrate 180. In some embodiments, the trench 190 does not penetrate through the cap substrate 180.

In some embodiments, the trench 190 is a ring trench. In some embodiments, the width $W_2$ of the trench 190 is in a range from about 100 nm to about 100 μm. In some embodiments, the sidewalls of the trench 190 are substantially perpendicular to the surface 180A of the cap substrate 180. In some other embodiments, the sidewalls of the trench 190 are inclined to the surface 180A of the cap substrate 180. The trench 190 may gradually shrink from the surface 180A of the cap substrate 180. The size and/or profile of the trench 190 can be varied according to requirements. Multiple deposition, coating, and/or etching processes may be used to form the trenches including the trench 190.

Figure 1D:
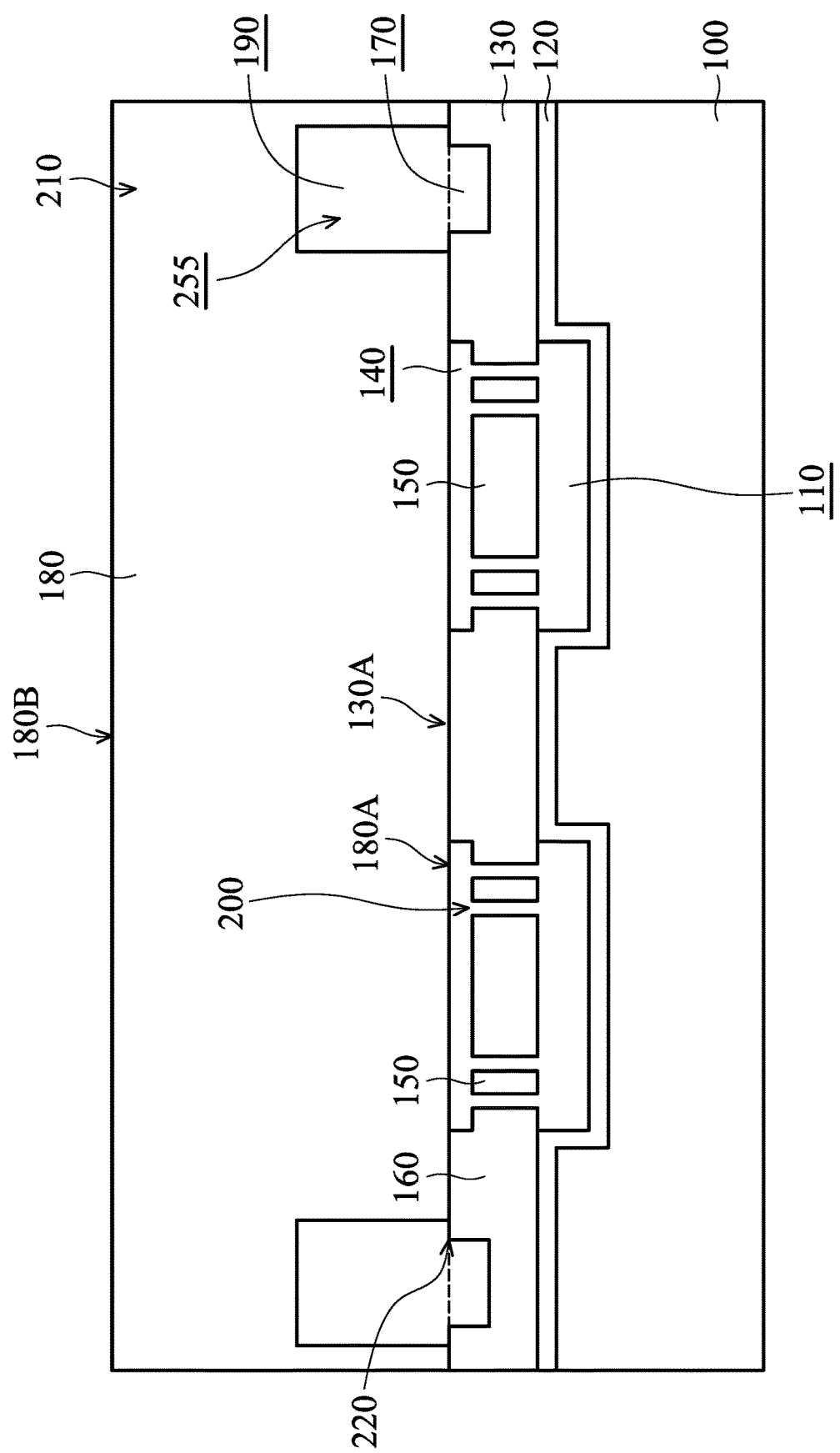

As shown in FIG. 1D, the cap substrate 180 shown in FIG. 1C is aligned and bonded to the semiconductor substrate 130 shown in FIG. 1B, in accordance with some embodiments. In some embodiments, the surface 180A of the cap substrate 180 is bonded to the surface 130A of the semiconductor substrate 130. As a result, the cavities including the cavity 140 in the semiconductor substrate 130 are substantially hermetically sealed by the cap substrate 180. Therefore, the cavity 140 and the cavity 110 form a closed chamber (cavity) 200.

The chamber 200 is surrounded and sealed by the cap substrate 180, the semiconductor substrate 130 and the substrate 100. The chamber 200 surrounds the movable features 150 and allows the movable features 150 to have free movement so as to achieve mechanical functionality. In some embodiments, the chamber 200 is a substantially vacuum chamber. In some other embodiments, the chamber 200 is a non-vacuum chamber. The pressure in the chamber 200 is fine-tuned according to requirements.

As shown in FIG. 1D, the trench 190 in the cap substrate 180 is substantially aligned to the trench 170 in the semiconductor substrate 130, in accordance with some embodiments. As a result, the trench 190 is connected with the trench 170. In some embodiments, since the combination of the trench 190 and the trench 170 penetrates through the cap substrate 180 into the semiconductor substrate 130, the interface 220 between the cap substrate 180 and the semiconductor substrate 130 is disconnected.

In some embodiments, the cap substrate 180 includes a portion 210 over the trench 190 and the trench 170. The portion 210 vertically overlaps the trench 190 and the trench 170. The trench 190 and the trench 170 are separated from the chamber 200. As a result, the trench 190 and the trench 170 form another closed chamber 255. The chamber 255 is surrounded and substantially hermetically sealed by the cap substrate 180 and the semiconductor substrate 130. In some embodiments, the chamber 255 is a substantially vacuum chamber. In some other embodiments, the chamber 255 is a non-vacuum chamber.

In some embodiments, the width $W_1$ of the trench 170 is less than the width $W_2$ of the trench 190. However, embodiments of the disclosure are not limited thereto. In some other embodiments, the width $W_1$ of the trench 170 is substantially equal to the width $W_2$ of the trench 190. In some embodiments, the ratio of the width $W_2$ to the width $W_1$ (i.e., $W_2/W_1$) is in a range from about 1 to about 2000.

In some embodiments, the width $W_1$ of the trench 170 and the width $W_2$ of the trench 190 are fine-tuned according to the alignment capability of a bonder for bonding the cap substrate 180 and the semiconductor substrate 130 together. The alignment capability of a bonder may be referred to as the overlay maximum. In some embodiments, the sum of the width $W_1$ and the width $W_2$ is substantially equal to or less than two times the overlay maximum so as to achieve precise alignment. In some embodiments, the overlay maximum is in a range from about 50 nm to about 100 μm. Embodiments of the disclosure are not limited thereto.

In some embodiments, the trench 170 is shallower than the trench 190. However, embodiments of the disclosure are not limited thereto. The depth $D_1$ of the trench 170 may be substantially equal to or less than the depth $D_2$ of the trench 190. In some embodiments, the ratio of the total depth of the trench 170 and the trench 190 to the width $W_2$ of the trench 190 (i.e., $(D_1+D_2)/W_2$) is in a range from about 0.1 to about 50, such as from about 1 to about 50. As a result, it is advantageous for a material, which will be described in more detail later, to be deposited in the trench 190 and the trench 170.

In some embodiments, the cap substrate 180 and the semiconductor substrate 130 are bonded together by using a fusion bonding process, an anodic bonding process, an adhesive bonding process, a glass frit bonding process, a SAB process, another suitable bonding process, or a combination thereof.

In some embodiments of the fusion bonding process, the cap substrate 180 and the semiconductor substrate 130 are first pre-bonded. During the pre-bonding, the cap substrate 180 and the semiconductor substrate 130 are aligned. After the alignment, the cap substrate 180 and the semiconductor substrate 130 are pressed against each other. A low pressing force may be applied to press the cap substrate 180 and the semiconductor substrate 130 against each other. The pre-bonding may be performed at a room temperature or higher temperatures. The pre-bonding may be performed at an atmosphere pressure or a controlled ambient.

After the pre-bonding of the fusion bonding process, the surface 180A of the cap substrate 180 and the surface 130A of the semiconductor substrate 130 are bonded together. A thermal process may be subsequently performed to improve the bonding strength between the cap substrate 180 and the semiconductor substrate 130. When the cap substrate 180 and the semiconductor substrate 130 are heated, strong covalent bonds are formed between the cap substrate 180 and the semiconductor substrate 130. The covalent bonds may be semiconductor-containing bonds, such as Si—Si bonds. As a result, the cap substrate 180 and the semiconductor substrate 130 are directly and strongly bonded together through Van Der Waals force.

In some embodiments, the surface 180A of the cap substrate 180 is in direct contact with the surface 130A of the semiconductor substrate 130. In some embodiments, there is substantially no gap or void between the surface 180A of the cap substrate 180 and the surface 130A of the semiconductor substrate 130.

Many variations and/or modifications can be made to embodiments of the disclosure. In some other embodiments, a plasma treatment is applied to the cap substrate 180 and/or the semiconductor substrate 130 before the pre-bonding so as to assist in the fusion bonding process.

In some embodiments, an annealing process is performed over the cap substrate 180 and the semiconductor substrate 130 during and/or after the fusion bonding process to increase the bonding strength. For example, a rapid thermal annealing process is performed. In some embodiments, the annealing process is performed at a temperature in a range from about 200° C. to about 350° C.

In some embodiments of the anodic bonding process, the cap substrate 180 includes a glass-containing material, another anodic bondable material, or a combination thereof. During the anodic bonding process, the cap substrate 180 and the semiconductor substrate 130 are bonded and heated at a temperature in a range from about 200° C. to about 400° C. As a result, ion migration occurs between the cap substrate 180 and the semiconductor substrate 130. For example, sodium ions in the cap substrate 180 are drawn across the interface 220 between the cap substrate 180 and the semiconductor substrate 130 to form a solid chemical bond. In some embodiments, the surface 180A of the cap substrate 180 is in direct contact with the surface 130A of the semiconductor substrate 130. In some embodiments, no annealing process is performed after the semiconductor substrate 130 is bonded to the substrate 100.

In some embodiments of the adhesive bonding process, a bonding layer is used to attach the cap substrate 180 and the semiconductor substrate 130 together. The cap substrate 180 is separated from the semiconductor substrate 130 by the bonding layer. In some embodiments, the surface 180A of the cap substrate 180 is not in direct contact with the surface 130A of the semiconductor substrate 130. The bonding layer may include polymer, glue, epoxy, photoresist, another suitable material, or a combination thereof. In some embodiments, the bonding layer is deposited over the cap substrate 180 and/or the semiconductor substrate 130. The bonding layer may be patterned to define bonding areas. Afterwards, the cap substrate 180 and the semiconductor substrate 130 are aligned and then bonded through the bonding layer at a temperature in a range from about 100° C. to about 300° C.

In some embodiments of the glass frit bonding process, a glass-containing layer is used to attach the cap substrate 180 and the semiconductor substrate 130 together. The glass-containing layer may have a low melting point. The glass-containing layer may be a glass frit material, a glass-ceramic material, another suitable material, or a combination thereof. In some embodiments, the glass-containing layer is deposited over the cap substrate 180 and/or the semiconductor substrate 130. The glass-containing layer may be patterned to define bonding areas. Afterwards, the cap substrate 180 and the semiconductor substrate 130 are pre-bonded and then heated. As a result, the glass-containing layer forms a solid bond between the cap substrate 180 and the semiconductor substrate 130.

In some embodiments, the cap substrate 180 does not include a metal feature before and during the bonding process of the cap substrate 180 and the semiconductor substrate 130, but embodiments of the disclosure are not limited thereto. In some embodiments, the bonding of the cap substrate 180 and the semiconductor substrate 130 does not involve a metal bonding process, such as a eutectic bonding process or a hybrid bonding process. As a result, the bonding of the cap substrate 180 and the semiconductor substrate 130 is prevented from high-temperature and high-pressing force.

In some embodiments, no eutectic alloy is formed between the cap substrate 180 and the semiconductor substrate 130. In some embodiments, no metal squeeze and/or metal diffusion occurs between the cap substrate 180 and the semiconductor substrate 130 during the bonding process of the cap substrate 180 and the semiconductor substrate 130. There may be no intermediate metal layer formed between the cap substrate 180 and the semiconductor substrate 130 during the bonding process of the cap substrate 180 and the semiconductor substrate 130.

Figure 1E:
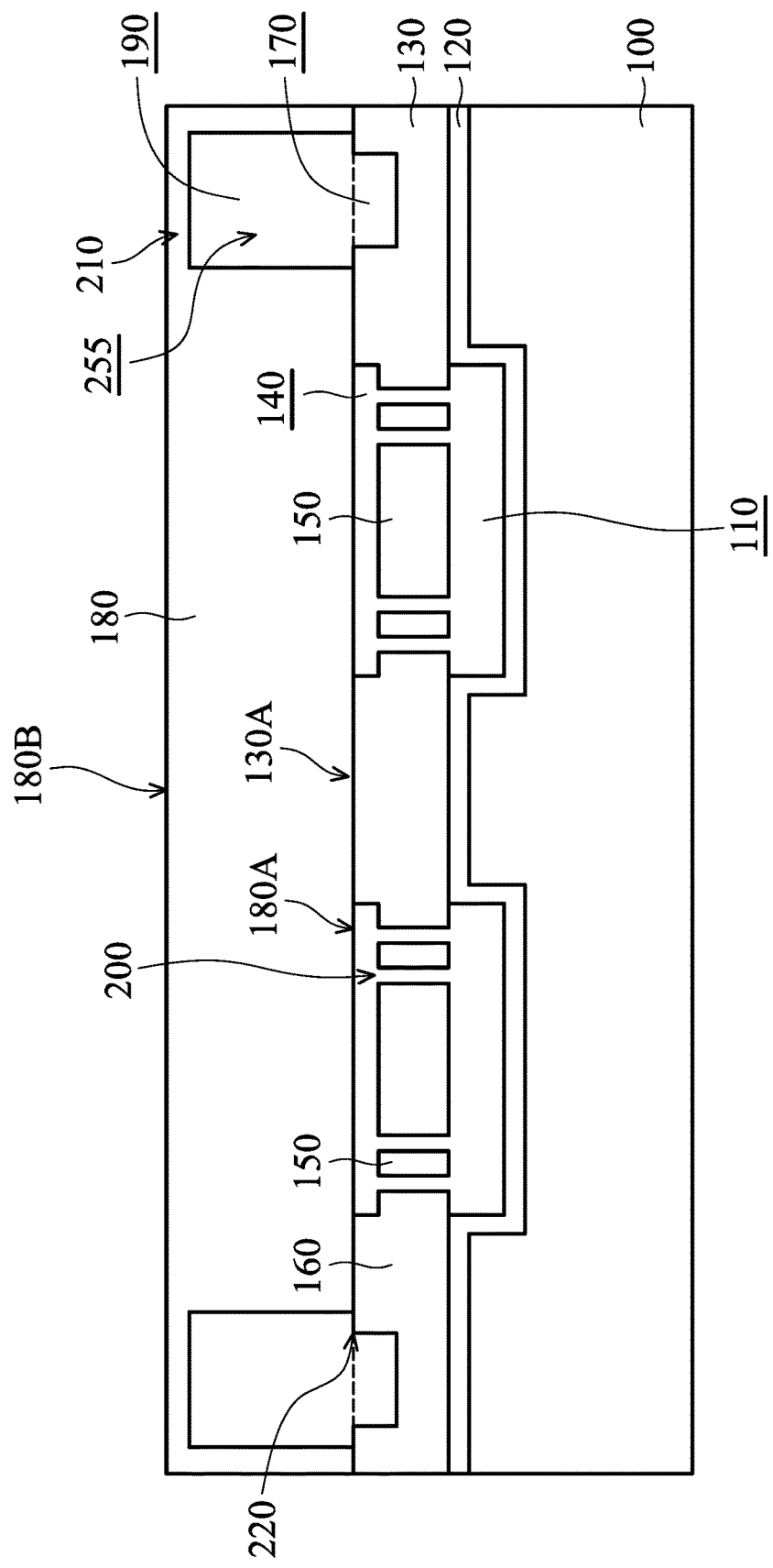

As shown in FIG. 1E, the cap substrate 180 is partially removed, in accordance with some embodiments. As a result, the cap substrate 180 is thinned. In some embodiments, the portion 210 overlapping the trench 190 and the trench 170 is partially removed and becomes thin. In some embodiments, the chamber 255 formed of the trench 190 and the trench 170 remains substantially hermetically sealed by the portion 210 of the cap substrate 180 and the semiconductor substrate 130.

In some embodiments, a planarization process is used to partially remove and thin the cap substrate 180. The planarization process includes a grinding process, a chemical mechanical polishing (CMP) process, an etching process, another applicable process, or a combination thereof.

Many variations and/or modifications can be made to embodiments of the disclosure. In some other embodiments, the planarization process is not performed.

Figure 1F:
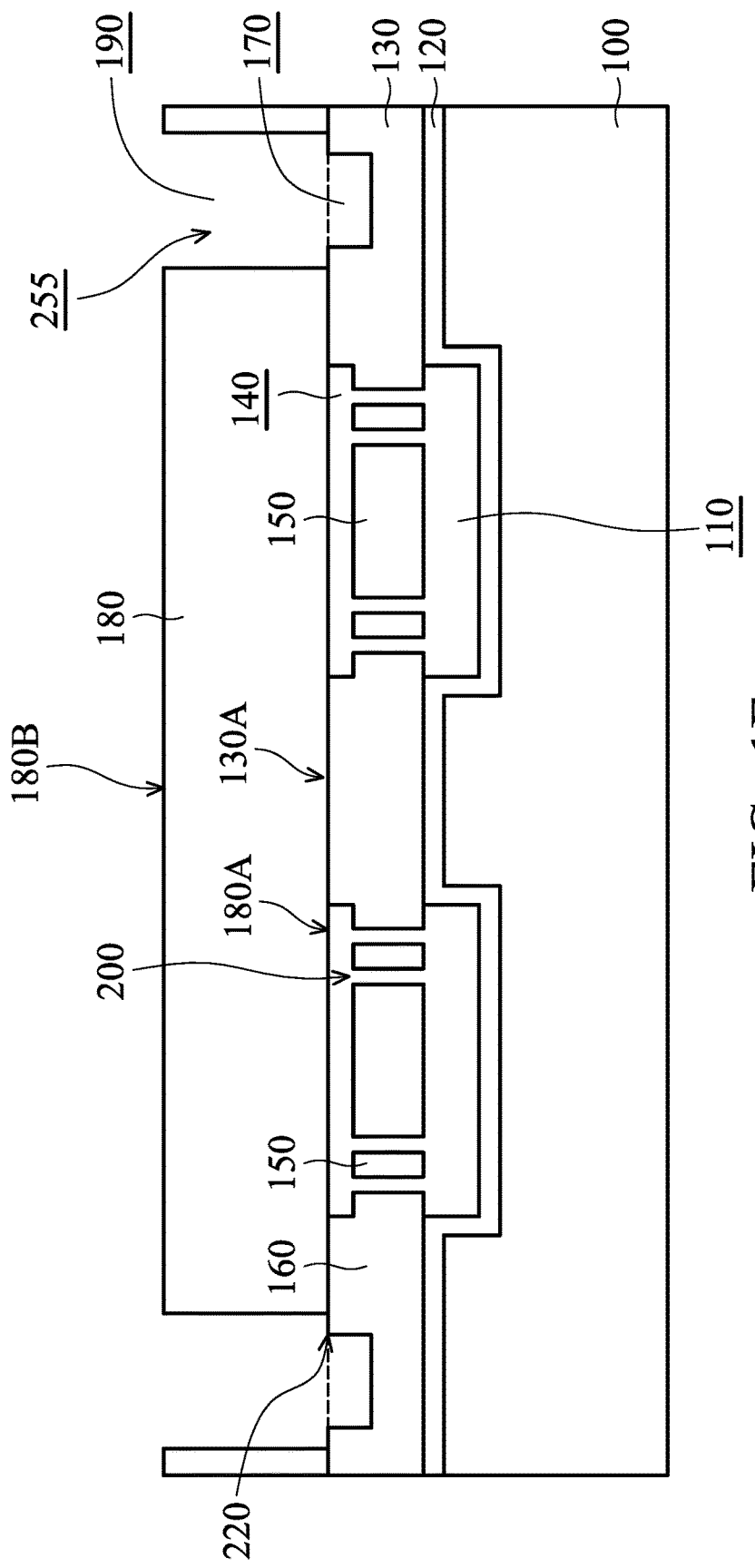

As shown in FIG. 1F, the portion 210 of the cap substrate 180 is removed, in accordance with some embodiments. As a result, the chamber 255 formed of the trench 190 and the trench 170 is exposed from the surface 180B of the cap substrate 180. In some embodiments, the trench 190 penetrates through the cap substrate 180.

In some embodiments, the portion 210 of the cap substrate 180 is removed using an etching process, another applicable process, or a combination thereof. The etching process is a dry etching process or a wet etching process. In some embodiments, the etching process is performed until the trench 190 and the trench 170 are exposed.

In some embodiments, the chamber 255 formed of the trench 190 and the trench 170 becomes open to the atmosphere after the removal of the portion 210. In some embodiments, the surface 130A of the semiconductor substrate 130 becomes partially exposed after the removal of the portion 210. Embodiments of the disclosure are not limited thereto. In some other embodiments, the width $W_1$ of the trench 170 is substantially equal to the width $W_2$ of the trench 190, and the surface 130A of the semiconductor substrate 130 is not exposed after the removal of the portion 210.

Many variations and/or modifications can be made to embodiments of the disclosure. In some other embodiments, the trench 190 penetrates through the cap substrate 180 before the cap substrate 180 is bonded to the semiconductor substrate 130. As a result, the trench 190 and the trench 170 are open to the atmosphere after the cap substrate 180 is bonded to the semiconductor substrate 130.

Figure 1G:
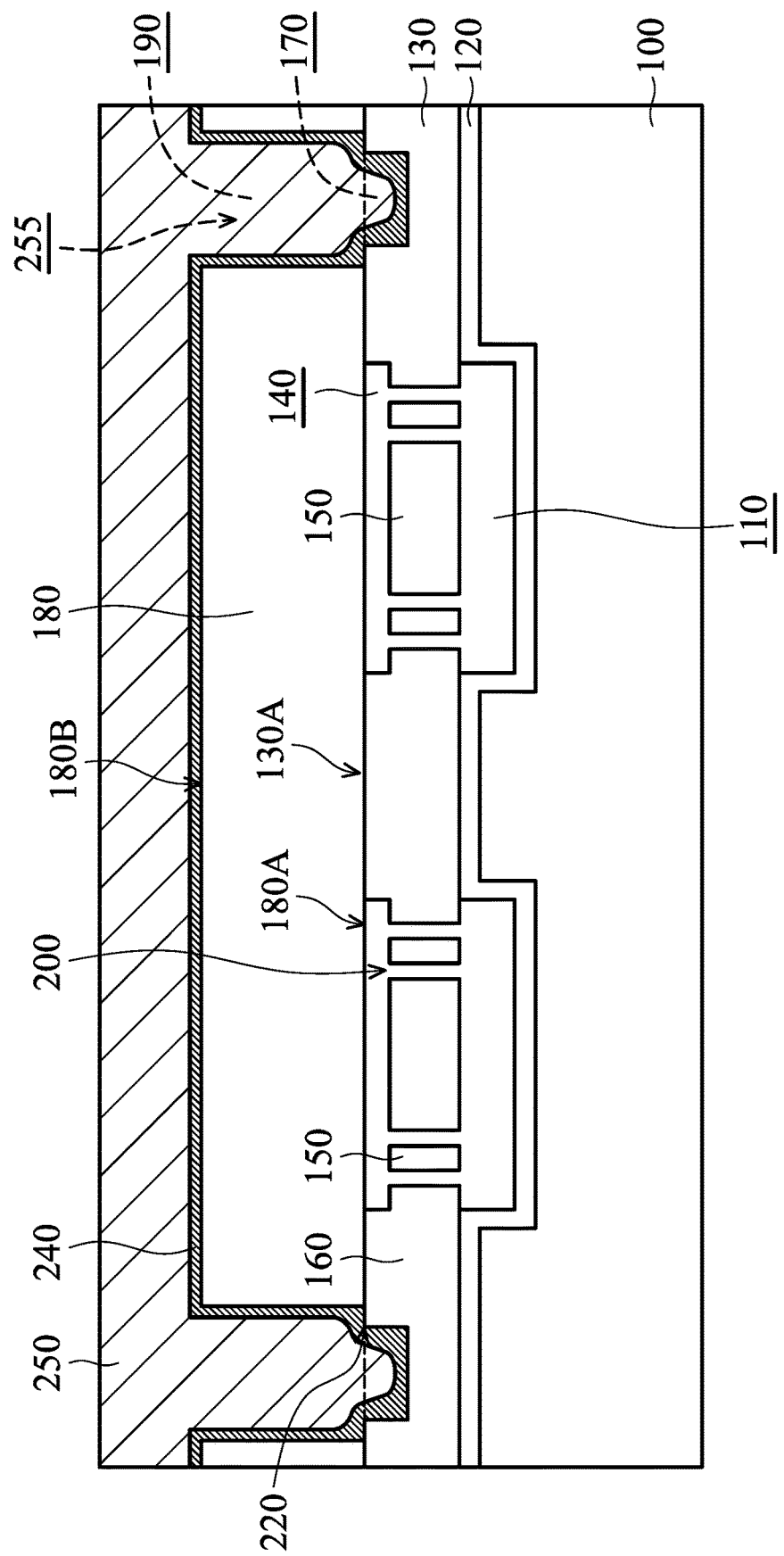

As shown in FIG. 1G, the chamber 255 formed of the trench 190 and the trench 170 is filled with a sealing layer 240 and a sealing layer 250, in accordance with some embodiments. The sealing layer 240 may be sandwiched between the cap substrate 180 and the sealing layer 250 and between the semiconductor substrate 130 and the sealing layer 250. The sealing layer 240 may be referred to as a seed layer.

In some embodiments, the sealing layer 240 covers the sidewalls and the bottom surface of the trench 190. In some embodiments, the sealing layer 240 covers the sidewalls and the bottom surface of the trench 170. The thickness and/or profile of the sealing layer 240 can be varied according to requirements. In some embodiments, the sealing layer 240 overlaps and intersects with the interface 220 between the cap substrate 180 and the semiconductor substrate 130. As a result, the sealing layer 240 seals the interface 220.

In some embodiments, the sealing layer 250 fills the remaining space of the chamber 255. The sealing layer 250 may be referred to as filler. In some embodiments, the sealing layer 250 overlaps and intersects with the interface 220 between the cap substrate 180 and the semiconductor substrate 130.

In some embodiments, the trench 190 and the trench 170 are hollow before the filling of the sealing layer 240 and the sealing layer 250, as shown in FIG. 1F. In some embodiments, the trench 190 is partially or completely filled with the sealing layer 240 and the sealing layer 250. In some embodiments, the trench 170 is partially or completely filled with the sealing layer 240 and the sealing layer 250. In some embodiments, the sealing layer 240 and the sealing layer 250 fill up the chamber 255 and extend onto the surface 180B of the cap substrate 180.

In some embodiments, the sealing layer 240 and/or the sealing layer 250 is made of a metal material. The metal material includes copper (Cu), aluminum (Al), gold (Au), tin (Sn), titanium (Ti), titanium nitride (TiN), another suitable material, or a combination thereof. In some embodiments, the metal material is deposited using a physical vapor deposition (PVD) process, a chemical vapor deposition (CVD) process, an electroplating process, an electroless plating process, a sputtering process, another applicable process, or a combination thereof.

Many variations and/or modifications can be made to embodiments of the disclosure. In some other embodiments, the sealing layer 240 and/or the sealing layer 250 is made of a dielectric material (or an insulating material). For example, the sealing layer 240 may be made of a metal material while the sealing layer 250 may be made of a dielectric material. The material of the sealing layer 240 and/or the sealing layer 250 may be flowable.

The sealing layer 240 may include oxide, nitride, epoxy, polymer, glass-ceramic, another suitable material, or a combination thereof. The polymer may be a thermoplastic material or a thermoset plastic material. In some embodiments, the sealing layer 240 includes silicon oxide, silicon nitride, silicon oxynitride, polyimide, BCB, polybenzoxazole (PBO), polymethylmethacrylate (PMMA), hexamethyldisilazane (HMDS), glass frit, silicone, siloxane, acrylates, silicate glass, solder resist, silicon carbide, another suitable material, or a combination thereof. In some embodiments, the sealing layer 240 is deposited using a CVD process, a spin-on process, a spray coating process, an atomic layer deposition (ALD) process, a PVD process, another applicable process, or a combination thereof.

Figure 1H:
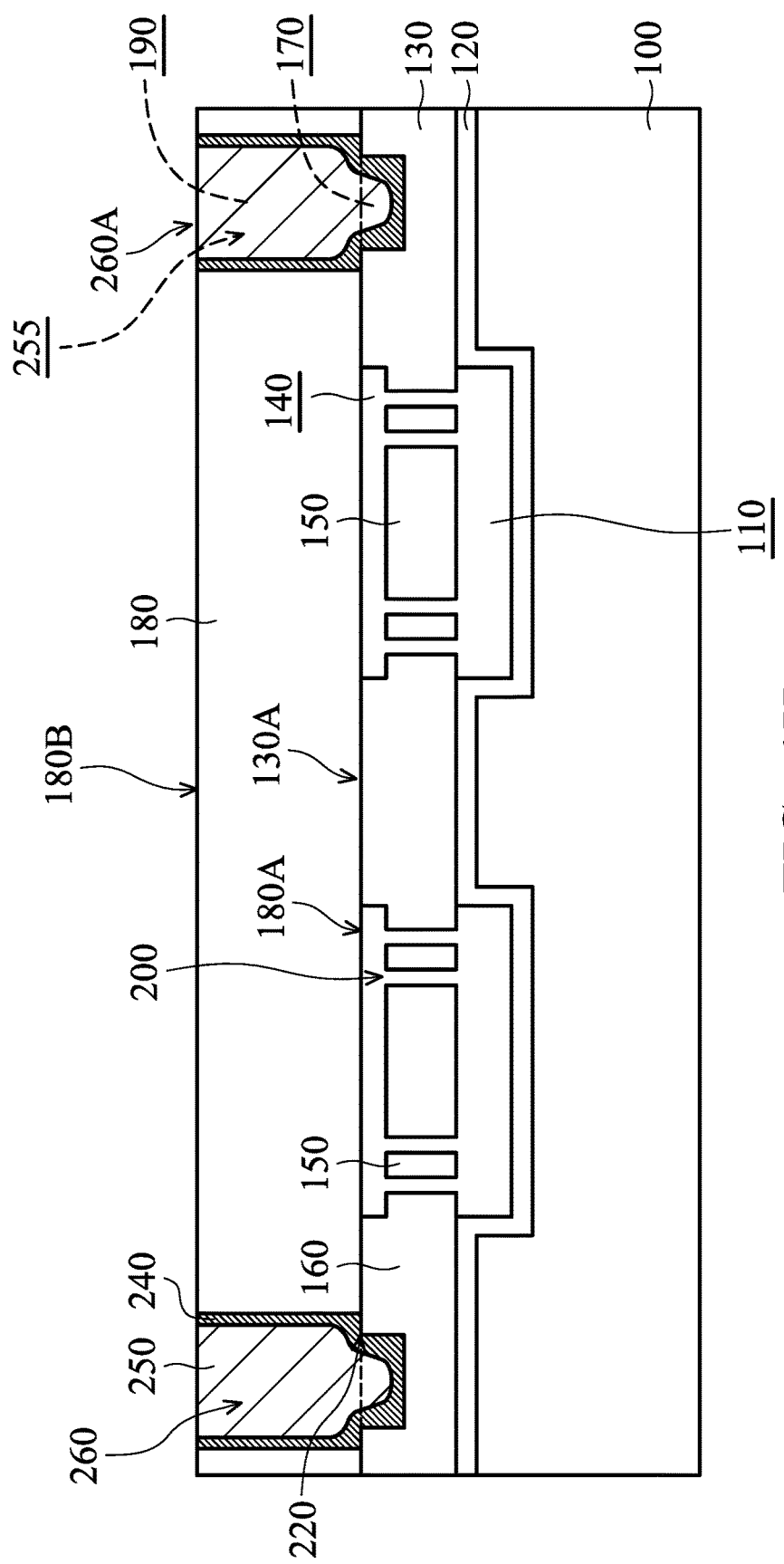

As shown in FIG. 1H, the sealing layer 240 and the sealing layer 250 are partially removed, in accordance with some embodiments. Portions of the sealing layer 240 and the sealing layer 250, which extend outside the chamber 255 and cover the surface 180B of the cap substrate 180, are removed. As a result, the remaining portion of the sealing layer 240 and the sealing layer 250 in the chamber 255 form a sealing feature 260.

In some embodiments, the trench 190 is partially or completely filled with the sealing feature 260. In some embodiments, the trench 170 is partially or completely filled with the sealing feature 260. In some embodiments, the sealing feature 260 has a surface 260A that is substantially coplanar with the surface 180B of the cap substrate 180. In some other embodiments, the surface 260A of the sealing feature 260 is recessed from the surface 180B of the cap substrate 180. In some embodiments, the sealing feature 260 directly adjoins the cap substrate 180 and the semiconductor substrate 130.

In some embodiments, the sealing feature 260 penetrates through the cap substrate 180 and continuously extends into the semiconductor substrate 130. In some embodiments, the sealing feature 260 extends across and intersects with the interface 220 between the cap substrate 180 and the semiconductor substrate 130. As a result, the interface 220 is sealed by the sealing feature 260.

Figure 2:
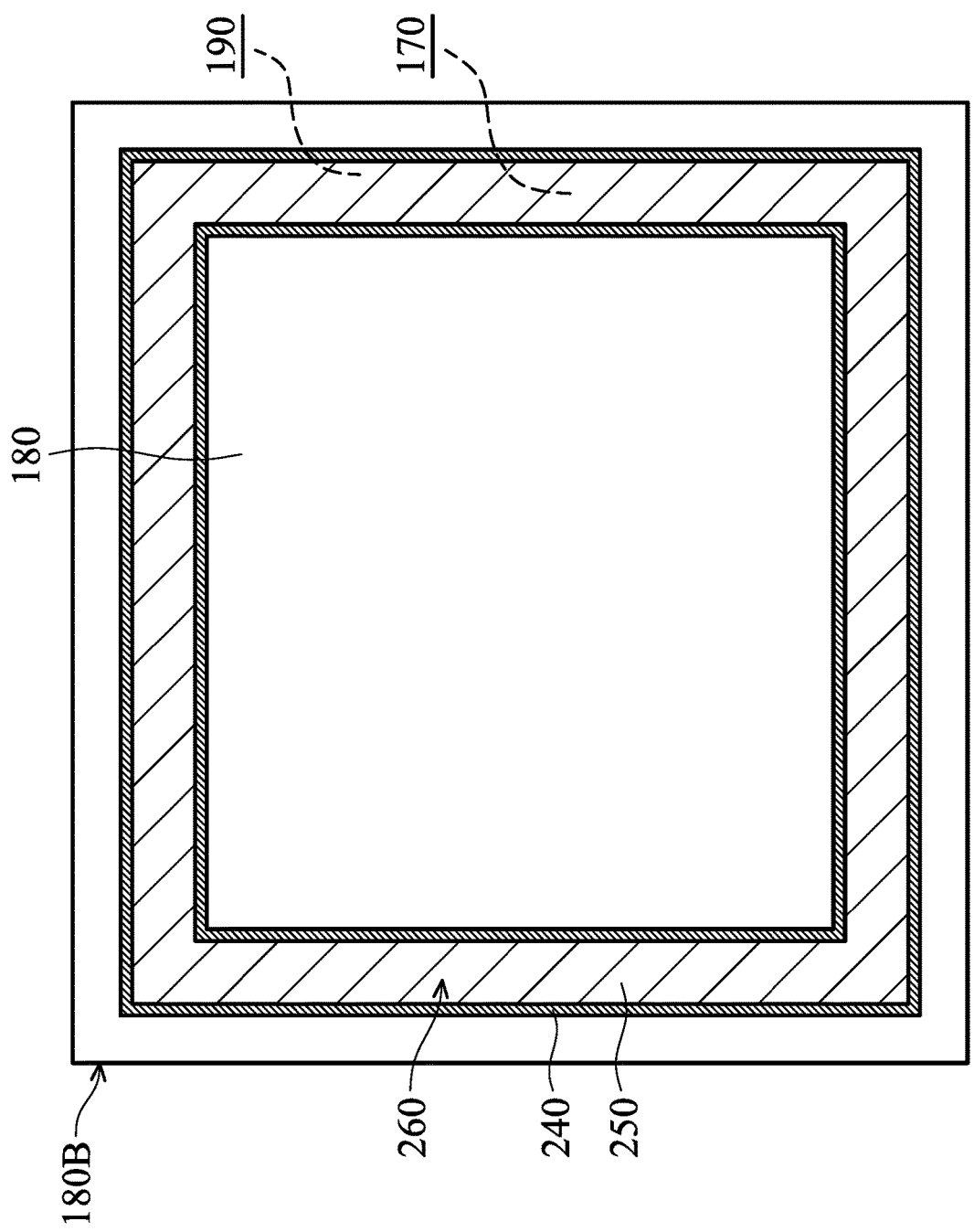
FIG. 2 is a top view of a semiconductor device structure, in accordance with some embodiments.

In some embodiments, the sealing feature 260 is referred to as a seal ring, as shown in FIG. 2. FIG. 2 is a top view of a semiconductor device structure, in accordance with some embodiments. The top-view profile of the sealing feature 260 may be rectangular, square, circular, circle-like, oval, or another suitable shape. The size and/or profile of the sealing feature 260 can be varied according to requirements.

In some embodiments, the sealing feature 260 in the chamber 255 continuously encloses the cavity 140. In some embodiments, the sealing feature 260 continuously encircles the movable features 150. In some embodiments, the sealing feature 260 continuously wraps the interface 220 between the cap substrate 180 and the semiconductor substrate 130. As a result, the interface 220 is substantially hermetically sealed by the sealing feature 260. In some embodiments, the sealing feature 260 does not include eutectic alloy, and the interface 220 is not sealed by eutectic alloy.

In some embodiments, a planarization process is used to partially remove the sealing layer 240 and the sealing layer 250. The planarization process includes a grinding process, a CMP process, an etching process, another applicable process, or a combination thereof.

In accordance with some embodiments, the sealing feature 260 provides the chamber 200 with further hermetic protection. In some embodiments, the sealing layer 240 made of a metal material can provide the chamber 200 with improved hermetic protection. As a result, it can be ensured that the desired pressure in the chamber 200 is substantially not changed during the processing steps. Therefore, the device performance of the semiconductor device structure is significantly enhanced.

In accordance with some embodiments, the sealing feature 260 penetrates through the cap substrate 180 and is anchored into the semiconductor substrate 130. As a result, the sealing feature 260 provides enhanced bonding strength between the cap substrate 180 and the semiconductor substrate 130. Therefore, the reliability of the semiconductor device structure is significantly enhanced.

As mentioned above, the width $W_1$ of the trench 170 is less than or substantially equal to the width $W_2$ of the trench 190, in accordance with some embodiments. Consequently, it is easier for the trench 190 in the cap substrate 180 to be precisely aligned to the trench 170 in the semiconductor substrate 130. Furthermore, it is also advantageous for the material of the sealing feature 260 to be deposited in the trench 190 and the trench 170. The coverage of the sealing feature 260 in the trench 190 and the trench 170 is good. Accordingly, it can be ensured that the chamber 200 is well-sealed by the sealing feature 260. In some embodiments, a portion of the sealing feature 260 embedded in the cap substrate 180 is wider than another portion of the sealing feature 260 embedded in the semiconductor substrate 130.

In accordance with some embodiments, the ratio of the width $W_2$ to the width $W_1$ (i.e., $W_2/W_1$) is in a range from about 1 to about 2000. In some cases, the ratio $W_2/W_1$ should be substantially equal to or greater than about 1. An overlay (OVL) shift or a misalignment between the trench 190 and the trench 170 may occur during the bonding process of the cap substrate 180 and the semiconductor substrate 130. If the ratio $W_2/W_1$ is less than about 1, it becomes difficult to fill the trench 170 with the sealing feature 260. As a result, the sealing feature 260 may not surround the interface 220 between the cap substrate 180 and the semiconductor substrate 130. The sealing feature 260 may not provide enough hermetic protection. However, embodiments of the disclosure are not limited thereto. In some other cases, the ratio $W_2/W_1$ may be less than about 1.

In some cases, the ratio $W_2/W_1$ should be substantially equal to or less than about 2000. If the ratio $W_2/W_1$ is greater than about 2000, the sealing feature 260 may not provide sufficient bonding strength between the cap substrate 180 and the semiconductor substrate 130. Embodiments of the disclosure are not limited thereto. In some other cases, the ratio $W_2/W_1$ may be greater than about 2000.

In accordance with some embodiments, the ratio of the total depth of the trench 170 and the trench 190 to the width $W_2$ of the trench 190 (i.e., $(D_1+D_2)/W_2$) is in a range from about 0.1 to about 50. In some cases, the ratio $(D_1+D_2)/W_2$ should be substantially equal to or less than about 50. If the ratio $(D_1+D_2)/W_2$ is greater than about 50, it becomes difficult to fill the trench 170 and the trench 190 with the sealing feature 260. As a result, the sealing feature 260 may not provide the chamber 200 with sufficient hermetic protection. However, embodiments of the disclosure are not limited thereto. In some other cases, the ratio $W_2/W_1$ may be greater than about 50.

Afterwards, a singulation process is performed to form multiple semiconductor device structures. Each of the semiconductor device structures includes the sealing feature 260 embedded in the cap substrate 180 and the semiconductor substrate 130, as shown in FIG. 1H. In some embodiments, the singulation process includes a dicing process to cut the cap substrate 180, the semiconductor substrate 130 and the substrate 100 along scribe lines by a saw blade or laser beam. In some embodiments, the sealing feature 260 is not cut.

However, embodiments of the disclosure are not limited thereto. In some other embodiments, the portions of the sealing layer 240 and the sealing layer 250, which extend outside the trench 190 and cover the surface 180B of the cap substrate 180, are not removed. As a result, the sealing feature 260 includes the sealing layer 240 and the sealing layer 250 that extend from the trench 190 onto the surface 180B of the cap substrate 180, as shown in FIG. 1G. In some embodiments, the sealing feature 260 is cut during the dicing process.

Figure 3:
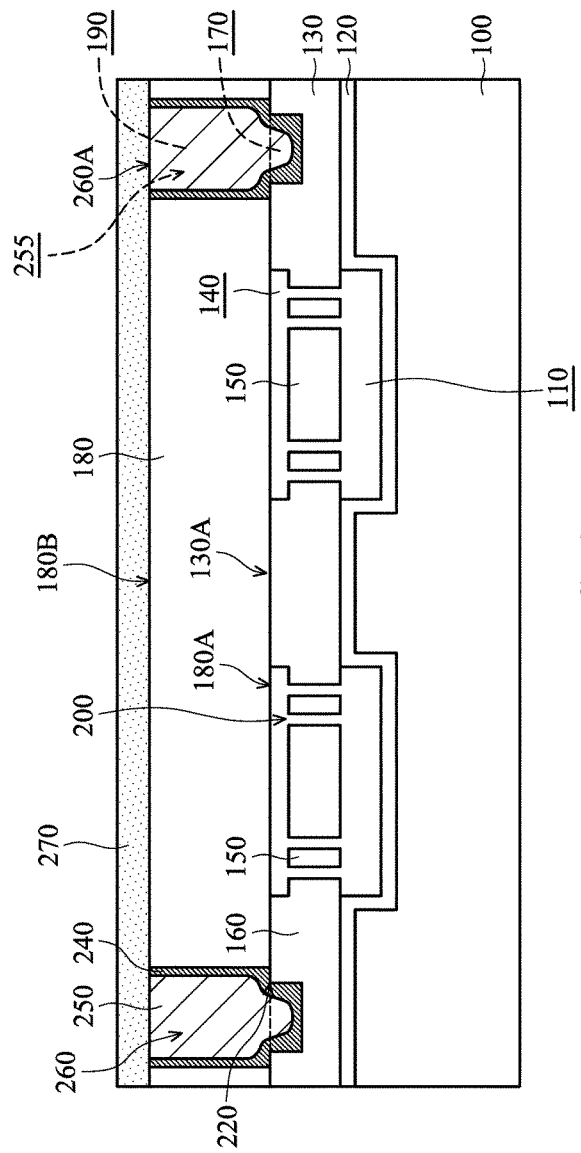
FIG. 3 is a cross-sectional view of a semiconductor device structure, in accordance with some embodiments.

Many variations and/or modifications can be made to embodiments of the disclosure. FIG. 3 is a cross-sectional view of a semiconductor device structure, in accordance with some embodiments. In some embodiments, the materials and/or formation methods of the semiconductor device structure shown in FIG. 3 are similar to those of the semiconductor device structure shown in FIGS. 1A-1H.

As shown in FIG. 3, a protection feature 270 is deposited over the cap substrate 180, in accordance with some embodiments. The protection feature 270 covers the surface 180B of the cap substrate 180 and the surface 260A of the sealing feature 260. The protection feature 270 provides the chamber 200 with further hermetic protection.

As mentioned above, in some embodiments, the trench 190 and/or the trench 170 is partially filled with the sealing feature 260. As a result, the protection feature 270 may fill the trench 190 and/or the trench 170.

In some embodiments, the protection feature 270 is made of a dielectric material. The protection feature 270 may include oxide, nitride, epoxy, polymer, glass-ceramic, another suitable material, or a combination thereof. The polymer may be a thermoplastic material or a thermoset plastic material. In some embodiments, the protection feature 270 includes silicon oxide, silicon nitride, silicon oxynitride, polyimide, BCB, PBO, PMMA, HMDS, glass frit, silicone, siloxane, acrylates, silicate glass, solder resist, silicon carbide, another suitable material, or a combination thereof.

In some embodiments, the protection feature 270 and the sealing feature 260 include different materials. For example, the protection feature 270 is made of a metal material and the sealing feature 260 is made of a dielectric material. However, embodiments of the disclosure are not limited thereto. In some other embodiments, the protection feature 270 and the sealing feature 260 include the same material.

In some embodiments, the protection feature 270 is deposited using a CVD process, a spin-on process, a spray coating process, an ALD process, a PVD process, another applicable process, or a combination thereof. After the deposition of the protection feature 270, a singulation process is performed to form multiple semiconductor device structures. In some embodiments, the singulation process includes a dicing process to cut the protection feature 270, the cap substrate 180, the semiconductor substrate 130 and the substrate 100 along scribe lines.

Although FIGS. 1H and 3 show that the sealing feature 260 includes the sealing layer 240 and the sealing layer 250, embodiments of the disclosure are not limited thereto. In some other embodiments, the sealing feature 260 includes a single sealing layer or more than two sealing layers.

Figure 4:
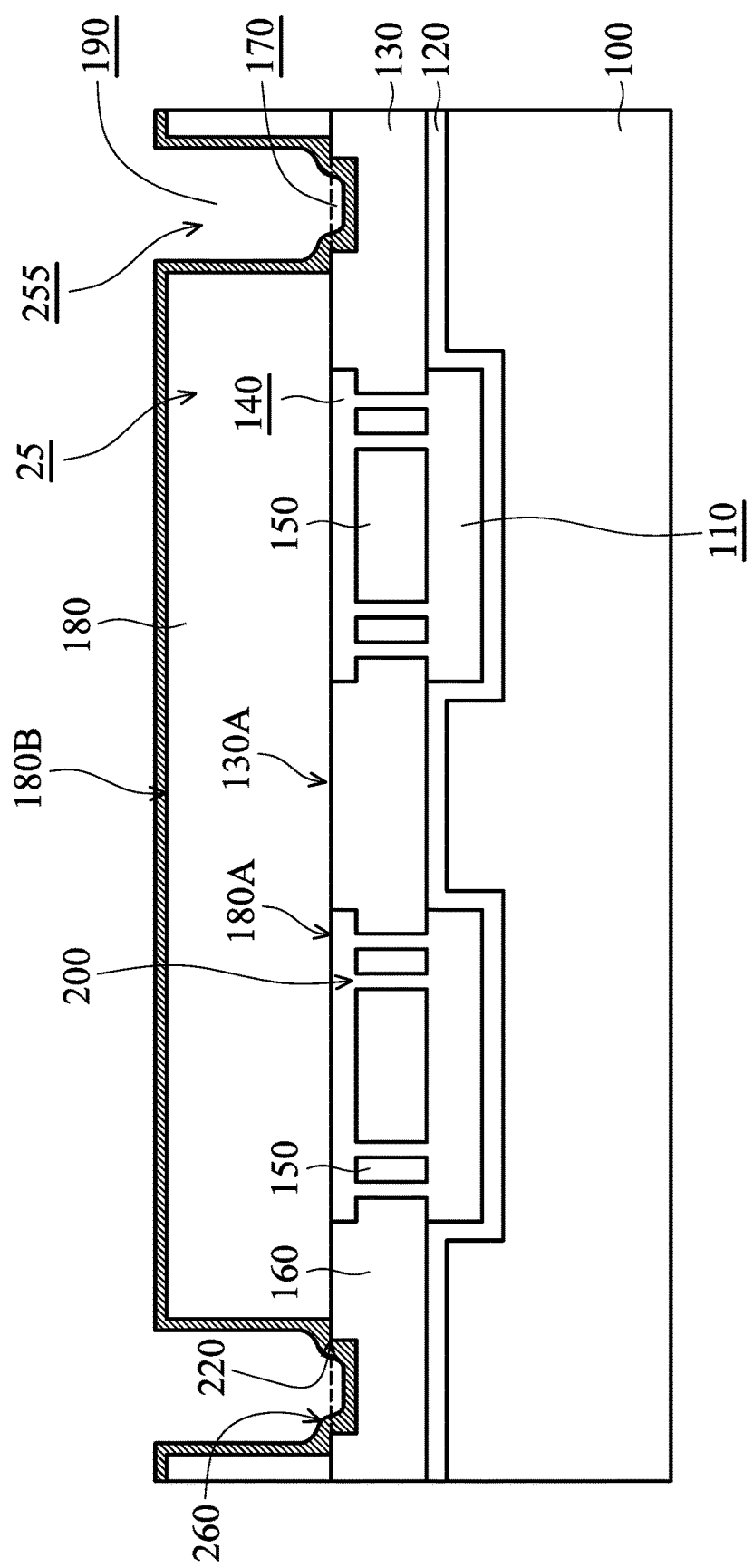
FIG. 4 is a cross-sectional view of a semiconductor device structure, in accordance with some embodiments.

FIG. 4 is a cross-sectional view of a semiconductor device structure, in accordance with some embodiments. In some embodiments, the materials and/or formation methods of the semiconductor device structure shown in FIG. 4 are similar to those of the semiconductor device structure shown in FIGS. 1A-1H.

As shown in FIG. 4, the sealing feature 260 includes a single sealing layer, in accordance with some embodiments. The interface 220 between the cap substrate 180 and the semiconductor substrate 130 is continuously surrounded and sealed by the sealing feature 260. In some embodiments, the sealing feature 260 does not surround the movable features 150. In some other embodiments, the sealing feature 260 continuously surrounds the movable features 150.

In some embodiments, the trench 190 is partially or completely filled with the sealing feature 260. In some embodiments, the trench 170 is partially or completely filled with the sealing feature 260. In some embodiments, the sealing feature 260 remains over the cap substrate 180 after the singulation process. In some other embodiments, the sealing feature 260 over the cap substrate 180 is removed before the singulation process. In some embodiments, the sealing feature 260 is made of a metal material or a dielectric material that are described above.

Many variations and/or modifications can be made to embodiments of the disclosure. The protection feature 270 show in FIG. 3 may be deposited over the cap substrate 180 shown in FIG. 4. The trench 190 and/or the trench 170 shown in FIG. 4 may be filled with the protection feature 270.

Although the formation method shown in FIGS. 1A-1H and 2-4 is used to form a semiconductor device structure including a MEMS device, embodiments of the disclosure are not limited. In some other embodiments, the formation method described in the disclosure can be used to form a semiconductor device structure including MEMS and CMOS devices. In some embodiments, the materials and/or formation methods of a semiconductor device structure including MEMS and CMOS devices are similar to those of the described semiconductor device structure. Many variations and/or modifications can be made to embodiments of the disclosure. The formation method described in the disclosure can be used to bond any suitable substrates with good hermetic protection.

Embodiments of the disclosure provide a semiconductor device structure. The semiconductor device structure includes a semiconductor substrate and a cap substrate that are bonded to each other. The semiconductor substrate with a first trench is directly bonded to the cap substrate with a second trench. Afterwards, a sealing feature fills the first and second trenches. As a result, the sealing feature provides further hermetic protection and bonding strength between the semiconductor substrate and the cap substrate. Therefore, device performance and the reliability of the semiconductor device structure are significantly enhanced.

In accordance with some embodiments, the bonding of the cap substrate and the semiconductor substrate does not involve a metal bonding process, such as a eutectic bonding process or a hybrid bonding process. As a result, the process window is large, and the bonding process of the cap substrate and the semiconductor substrate does not need to be performed with high-temperature and high-pressing force. Therefore, the semiconductor device structure is prevented from cracking. Furthermore, embodiments of the disclosure are not limited and can be applied to fabrication processes for advanced node or any suitable technology generation.

The fabrication cost and the time required for forming the semiconductor device structure are also greatly reduced.

In accordance with some embodiments, a semiconductor device structure is provided. The semiconductor device structure includes a semiconductor substrate including a cavity and a movable feature in the cavity. The semiconductor device structure also includes a cap substrate bonded to the semiconductor substrate to seal the cavity. There is an interface between the cap substrate and the semiconductor substrate. The semiconductor device structure further includes a sealing feature embedded in the semiconductor substrate and surrounding the cavity. The sealing feature extends across the interface and penetrates through the cap substrate.

In accordance with some embodiments, a semiconductor device structure is provided. The semiconductor device structure includes a semiconductor substrate having a first surface. The semiconductor substrate includes a cavity extending from the first surface and a movable feature in the cavity. The semiconductor device structure also includes a cap substrate bonded to the first surface of the semiconductor substrate to seal the cavity. The cap substrate has a second surface facing the first surface and a third surface opposite to the second surface. The semiconductor device structure further includes a sealing feature extending from the third surface across the second surface and the first surface so that the sealing feature is anchored into the semiconductor substrate.

In accordance with some embodiments, a method for forming a semiconductor device structure is provided. The method includes providing a semiconductor substrate having a first surface. The method also includes partially removing the semiconductor substrate from the first surface to form a cavity and a first trench in the semiconductor substrate and a movable feature in the cavity. The method further includes providing a cap substrate having a second surface and a third surface opposite to the second surface. In addition, the method includes partially removing the cap substrate from the second surface to form a second trench in the cap substrate. The method also includes bonding the second surface of the cap substrate to the first surface of the semiconductor substrate so that the cavity is sealed by the cap substrate. The first trench and the second trench are connected with each other and form a chamber. The method further includes forming a sealing feature over the third surface of the cap substrate to fill the chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   providing a semiconductor substrate having a first surface;
   partially removing the semiconductor substrate from the first surface to form a cavity and a first trench in the semiconductor substrate and a movable feature in the cavity;
   providing a cap substrate having a second surface and a third surface opposite to the second surface;
   partially removing the substrate from the second surface to form a second trench in the cap substrate;
   bonding the second surface of the cap substrate to the first surface of the semiconductor substrate so that the cavity is sealed by the cap substrate, wherein the first trench and the second trench are connected with each other and form a chamber; and
   forming a sealing feature over the third surface of the cap substrate to fill the chamber.

2. The method for forming a semiconductor device structure as claimed in claim 1, further comprising removing the sealing feature outside the chamber until the third surface of the cap substrate is exposed.

3. The method for forming a semiconductor device structure as claimed in claim 1, further comprising forming a protection feature covering the third surface of the cap substrate and the sealing feature.

4. The method for forming a semiconductor device structure as claimed in claim 1, wherein the formation of the sealing feature comprises:
   forming a first layer covering a sidewall of the chamber; and
   forming a second layer covering the first layer to fill the chamber.

5. The method for forming a semiconductor device structure as claimed in claim 1, further comprising thinning the cap substrate from the third surface before the formation of the sealing feature.

6. The method for forming a semiconductor device structure as claimed in claim 1, further comprising partially removing the cap substrate from the third surface to expose the chamber before the formation of the sealing feature.

7. The method for forming a semiconductor device structure as claimed in claim 1, wherein the first trench is formed in the semiconductor substrate during the formation of the cavity and the movable feature.

8. The method for forming a semiconductor device structure as claimed in claim 1, wherein the first trench has a first width and the second trench has a second width that is greater than the first width.

9. A method for forming a semiconductor device structure, comprising:
   partially removing a substrate to form a cavity and a first trench in the substrate and a movable feature in the cavity;
   partially removing a cap substrate to form a second trench in the cap substrate;
   bonding the cap substrate having the second trench and the substrate having the first trench together so that the cavity is sealed by the cap substrate, wherein the first trench and the second trench communicate with each other and form a chamber;
   partially removing the cap substrate to expose the chamber; and
   filling the chamber with a sealing feature, wherein the sealing feature penetrates through the cap substrate and extends across an interface between the cap substrate and the substrate.

10. The method for forming a semiconductor device structure as claimed in claim 9, wherein the first trench and the second trench are isolated from the cavity.

11. The method for forming a semiconductor device structure as claimed in claim 9, wherein the sealing feature comprises a single sealing layer, and the chamber is partially filled with the sealing feature.

12. The method for forming a semiconductor device structure as claimed in claim 9, wherein the sealing feature comprises a first portion in the substrate and a second portion in the cap substrate, and wherein the first portion has a first width and the second portion has a second width that is greater than the first width.

13. The method for forming a semiconductor device structure as claimed in claim 9, wherein the sealing feature surrounds and adjoins the interface between the cap substrate and the substrate.

14. The method for forming a semiconductor device structure as claimed in claim 9, wherein the sealing feature comprises a metal material, a dielectric material, or a combination thereof.

15. A method for forming a semiconductor device structure, comprising:
    bonding a first substrate to a second substrate;
    patterning a first substrate such that the first substrate has a first trench and a first cavity and comprises movable features suspended in the first cavity, wherein the second substrate has a second cavity connected with the first cavity;
    partially removing a cap substrate to form a second trench in the cap substrate;
    bonding the cap substrate having the second trench and the first substrate having the first trench together to seal the first cavity and the second cavity; and
    filling the first trench and the second trench with a sealing feature, wherein the sealing feature extends in the cap substrate and is anchored into the first substrate.

16. The method for forming a semiconductor device structure as claimed in claim 15, further comprising:
    thinning the cap substrate after the bonding of the cap substrate and the first substrate; and
    etching the cap substrate after the thinning of the cap substrate, wherein the first trench and the second trench together form a chamber, and wherein the chamber is closed until the etching of the cap substrate.

17. The method for forming a semiconductor device structure as claimed in claim 16, wherein the chamber is ring-shaped and surrounds the first cavity.

18. The method for forming a semiconductor device structure as claimed in claim 15, wherein the first substrate is bonded to the second substrate through a bonding layer, and wherein the first substrate is in contact with the cap substrate.

19. The method for forming a semiconductor device structure as claimed in claim 18, wherein the bonding layer extends in the second cavity without filling up the second cavity, and the sealing feature overlaps the bonding layer.

20. The method for forming a semiconductor device structure as claimed in claim 15, wherein the cap substrate is bonded to the first substrate using a fusion bonding process, an anodic bonding process, an adhesive bonding process, a glass frit bonding process, a SAB process, or a combination thereof.

* * * * *